United States Patent
Keehan

(10) Patent No.: US 6,391,979 B1
(45) Date of Patent: May 21, 2002

(54) EPOXIDIZED POLY-P-HYDROXYSTYRENE

(76) Inventor: Donald J. Keehan, 31012 Huntington Woods, Bay Village, OH (US) 44140

( * ) Notice: Subject to any disclaimer, the term of this patent is extended or adjusted under 35 U.S.C. 154(b) by 26 days.

(21) Appl. No.: 09/691,011

(22) Filed: Oct. 18, 2000

Related U.S. Application Data

(62) Division of application No. 09/300,300, filed on Apr. 27, 1999, now Pat. No. 6,180,723.

(51) Int. Cl.[7] .............................. C08F 8/08; C08F 16/10; C08F 116/10
(52) U.S. Cl. ...................... 525/328.8; 525/507
(58) Field of Search ................ 525/328.8, 507

(56) References Cited

U.S. PATENT DOCUMENTS

| | | | |
|---|---|---|---|
| 3,884,992 A | * 5/1975 | Shimizu et al. | |
| 4,020,225 A | * 4/1977 | Fujiwara et al. | 428/252 |
| 4,021,403 A | * 5/1977 | Fujiwara et al. | 428/415 |
| 4,390,664 A | * 6/1983 | Kanayama | 525/117 |
| 5,120,793 A | * 6/1992 | Gupta | 525/242 |
| 5,158,708 A | * 10/1992 | Yamamoto et al. | 523/457 |
| 5,212,244 A | * 5/1993 | Sugawara et al. | 525/193 |
| 5,331,344 A | * 7/1994 | Miyagawa et al. | 430/101 |

* cited by examiner

Primary Examiner—Robert E. L. Sellers
(74) Attorney, Agent, or Firm—Fay, Sharpe, Fagan, Minnich & McKee, LLP

(57) ABSTRACT

Disclosed are epoxy resins prepared by reacting p-hydroxystyrene and epichlorohydrin in the presence of one or more alkali agents. Also disclosed are epoxy resins prepared from reacting a p-hydroxystyrene polymer and one or more di-hydric phenol agents with epichlorohydrin in the presence of alkali. These epoxide resins have a low melt viscosity and when cured exhibit glass transition temperatures above 300° C.

5 Claims, No Drawings

US 6,391,979 B1

EPOXIDIZED POLY-P-HYDROXYSTYRENE

This application is a divisional of U.S. application Ser. No. 09/300,300 filed on Apr. 27, 1999, U.S. Pat. No. 6,180,723.

FIELD OF THE INVENTION

The present invention relates to a new class of epoxy resins prepared from one or more p-hydroxystyrene polymers.

BACKGROUND OF THE INVENTION

Epoxy resins are characterized by the presence of a three-membered ring known as the epoxy, epoxide, oxirane, or ethoxyline group. Commercial epoxy resins contain aliphatic, cycloaliphatic, or aromatic backbones. The capability of the epoxy ring to react with a variety of substrates imparts versatility to the resins. Treatment with curing agents gives insoluble and intractable thermoset polymers. In order to facilitate processing and modify cured resin properties, other constituents may be included in the compositions such as for example, fillers, solvents, diluents, plasticizers, accelerators, curatives, and tougheners.

One type of epoxy resin is made from epichlorohydrin and bisphenol A. Aliphatic polyols such as glycerol may be used instead of the aromatic bisphenol A.

Another type of epoxy resin is made from polyolefins oxidized with peracetic acid. These have more epoxide groups, within the molecule as well as in terminal positions, and can be cured with anhydrides, but require high temperatures. Many modifications of both types are made commercially. Halogenated bisphenols can be used to add flame-retardant properties.

Yet another type of epoxy resin is produced from novolak compounds. Such epoxy novolak resins are typically made by the reaction of epichlorohydrin with a novolak resin, i.e a phenol-formaldehyde type resin. These have a repeating epoxide structure which offers better resistance to high temperatures than the epichlorohydrin-bisphenol A type, and are especially useful as adhesives.

Upon curing, most epoxy resins form a tight cross-linked polymer network and are characterized by toughness, good adhesion, corrosive-chemical resistance, and good dielectric properties.

The manufacture of epoxy resins and processes for their production by the reaction of di-, tri-, and tetra-phenols and epichlorohydrin in the presence of a condensing agent such as caustic soda are well known.

These epoxy resins vary in physical state from liquids to solids. They are cured into a thermoset state by cross linking when reacted with tertiary, secondary or primary amines, anhydrides, lewis acids, lewis bases, amides, imidizoles, ureas, melamines, cyanate esters and other commonly used curing agents and catalysts.

The production of epoxy resins utilizing p-hydroxystyrene is known in the art. Due to the large quantity of reactive sites, this polymer, when cured, produces a relatively high crosslink density. Generally, the higher the crosslink density, the higher the chemical resistance and the higher the heat resistance.

High functionality epoxies, i.e. epoxy resins having a relatively high number of reactive sites, can be used in the manufacture of high performance coatings, adhesives, and fiber reinforced composites. One property of a cured epoxide polymer which is extremely desirable and useful is a high glass transition temperature, Tg. Generally, high Tg values impart high chemical resistance and excellent electrical properties. High functionality epoxies, upon curing, often exhibit high Tg values.

The use of epoxy resins as a matrix material for reinforced composites, molding compounds, casting resins, etc. is known. In such applications, it is desirable that the resins typically exhibit certain properties such as relatively high temperature resistance and high chemical resistance. These properties may be obtained by the use of high functionality resins such as novolak resins.

Unfortunately, conventional epoxy resins having high functionality, such as those based upon currently available p-hydroxystyrene and novolak agents, are difficult to work with due to their high melting points and relatively high viscosity prior to cure. Accordingly, there is a need for high functionality epoxy resins having a pre-cure viscosity that ranges from a low water-like liquid to a high honey-like material depending on the amount of functionality. In particular, it would be desirable to obtain a high functionality epoxy resin that has a low melt viscosity and a high Tg. Further, it would be desirable for such resins to be curable to a thermoset state by crosslinking upon reaction with tertiary, secondary or primary amines, anhydrides, acids, lewis acids, lewis bases, amides, imidizoles, ureas, meiamines, cyanate esters and other commonly used curing agents and catalysts.

SUMMARY OF THE INVENTION

It is an object of this invention to provide new high functionality epoxide polymers having low melt viscosity prior to curing, high glass transition temperatures upon curing, and a process for producing them. In a first aspect of the present invention, a process for producing such an epoxy agent is provided. The process involves providing at least one of three specific poly-p-hydroxystyrene polymers, and reacting such with epichlorohydrin.

In another aspect of the present invention, a process is provided for producing a high molecular weight epoxy agent by reacting a certain poly-p-hydroxystyrene polymer with one or more di-hydric phenol agents, and reacting such with epichlorohydrin.

The present invention also provides new classes of epoxy compounds having improved and superior properties as compared to conventional epoxy agents.

DESCRIPTION OF THE PREFERRED EMBODIMENTS

In accordance with a preferred aspect of the present invention, high molecular weight epoxy resins with high functionality, low epoxide equivalent weight, and which exhibit low melt viscosity prior to cure and high glass transition temperatures after cured, may be prepared by reacting certain poly-p-hydroxystyrene polymers and epichlorohydrin in the presence of one or more alkali agents.

Before turning attention to the details of the preferred embodiments of the present invention, it is instructive to address certain terminology utilized herein. Epoxide equivalent weight, as that term is used herein, refers to molecular weight divided by the number of reactive epoxy sites per molecule. High functionality epoxy resins, i.e. epoxy resins having a relatively high number of reactive epoxy sites per molecule, typically have relatively low epoxide equivalent weight. Preferably, the epoxy resins according to the present invention have an average functionality of from about 5 to about 70, and most preferably up to about 100 or higher. The term glass transition temperature, as used herein, is accorded its conventional and well understood definition. Generally, this is the temperature at which an amorphous material changes from a brittle vitreous state to a plastic state. The term melt viscosity, as used herein, refers to the viscosity of the material or resin prior to curing.

The preferred embodiment epoxy agents are formed by reacting one or more particular p-hydroxystyrene polymers and epichlorohydrin. Epichlorohydrin (also known as chloropropylene oxide, CAS: 106-89-8), is an epoxide having the structure:

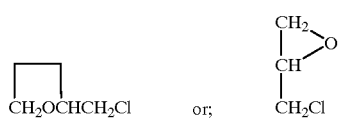

In reacting epichlorohydrin and p-hydroxystyrene agents (s), it is desirable to epoxidize all, or at least a majority of, phenol groups in the p-hydroxystyrene agents. Accordingly, an excess of epichlorohydrin for each equivalent of phenol is preferably employed. Thus, in a preferred process of the present invention, an excess of about 2 to about 10 moles of epichlorohydrin for each mole of total phenol groups is used.

The alkali or alkaline agent present in the reaction mixture is preferably an alkali metal hydroxide such as sodium, potassium or lithium hydroxide, and is present in an amount sufficient to neutralize the hydrochloric acid produced during the reaction, as well as to transform the chlorohydrin formed in the initial reaction of phenol and epichlorohydrin, to an epoxide-containing molecule. Preferably this amount is between about 1 mole and about 4 moles of alkali per mole of total phenolic groups that are present. In order to improve yields the alkali solution may include one or more alcohols rather than water.

The preferred poly-p-hydroxystyrene polymers that may be used in preparing the preferred embodiment epoxy resins are represented by the following structural formulas (I), (II), and (III).

Poly-p-hydroxystyrene-PG (polymer I) is a combination of linear styrenic and branched novolak type structures:

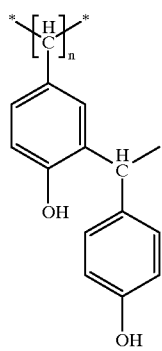

(I)

This polymer (I) is generally in the form of a tan powder, having a molecular weight of from about 4,500 to about 6,000. The variable n in the above structure typically ranges from about 18 to about 30, and preferably from about 20 to about 28. Polymer (I) preferably has a polydispersity of from about 2.0 to about 2.6. The glass transition temperature of polymer (I) is from about 135° to about 145° C.

Poly-p-hydroxystyrene novolak (polymer II) is a 100% branched polymer with no styrenic backbone character:

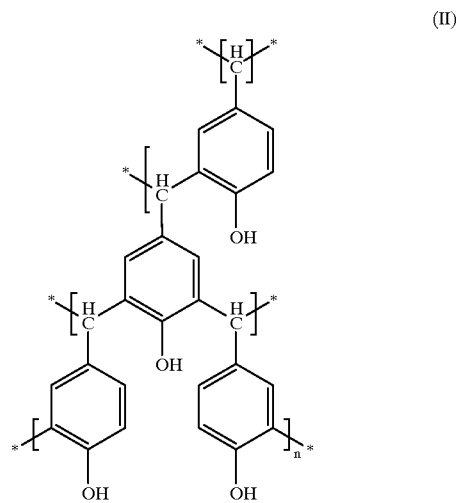

(II)

This polymer (II) is generally in the form of a white free-flowing powder, and is not derived from an aldehyde. Polymer (II) preferably has a molecular weight of from about 5,400 to about 7,000, and a polydispersity of from about 1.5 to about 1.9. The variable n in the above structure typically ranges from about 10 to about 20, and preferably from about 13 to about 17. The glass transition temperature of polymer (II) is preferably from about 1400 to about 145° C.

Poly-p-hydroxystyrene-PG-L (homopolymer of 4-ethenyl phenol) (polymer III) is a 100% linear styrenic backbone polymer having a wide range of molecular weights from 5,000 to 60,000:

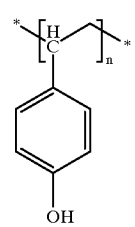

(III)

The variable n for polymer (III) ranges from about 30 to about 600, and preferably from about 40 to about 500.

Upon the completion of the reaction of one or more of the polymers (I) (II), and/or (III), with epichlorohydrin in the presence of an alkali, the resulting epoxized polymer is represented by the following theoretical structure (IV).

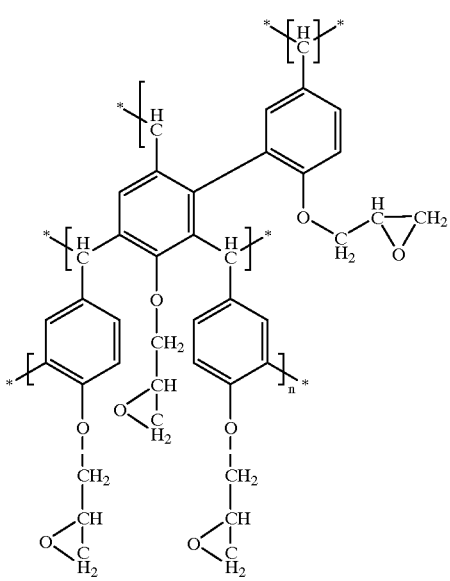

(IV)

This resulting epoxy novolak polymer (IV), as described in the accompanying examples, when suitably cured, provides a resin having significantly improved temperature and chemical resistance, strength, and durability. As previously noted, the term "novolak" as used herein generally refers to a phenol-formaldehyde type resin. The variable n in formula (IV) represents a number preferably ranging from about 10 to about 26. It is to be understood, however that the above structural formula (IV) represents an idealized version, and its exact composition may vary depending on the reaction conditions of the process. For example, a hindered hydroxyl could crosslink with an epoxy end cap.

The reaction mixture obtained contains salts, unreacted epichlorohydrin, excess alkali, and water, all of which should be removed to isolate the product (IV). This may be accomplished by dissolving the resin in a suitable solvent such as benzene, toluene, xylene, alcohol, etc., washing several times with water and separating the aqueous and organic layers. The solvent is preferably distilled off. The resin may be further purified by dissolving in acetone or alcohol, filtering off any solid impurities and evaporating the solvent. The final epoxy polymer has a relatively low epoxide equivalent weight, preferably within the range of from about 150 to about 260, and more preferably from about 200 to about 260.

An epoxy resin based upon the polymer (II) P-Hydroxystyrene-N is a solid at room temperature, with a high molecular (20,000–30,000) weight, a low epoxide equivalent (200–260) and a high functionality (100–110) polymer (IV). Accordingly, the preferred embodiment resin can be processed and may be subjected to subsequent mixing and other operations.

The epoxy resins prepared in accordance with this preferred method can be cured with tertiary, secondary or primary amines, anhydrides, acids, lewis acids, lewis bases, amides, imidizoles, ureas, melamines, cyanate esters, and other commonly used curing agents and catalysts. Upon curing, the resulting epoxy materials exhibit Tg's of at least about 300° C.

In another aspect, the present invention provides another group of high functionality epoxy resins whose pre-cure viscosity ranges from low water-like liquids to high honey-like liquid depending on the amount of functionality. This group of epoxy resins preferably have an average functionality of from about 5 to about 70, and most preferably up to about 100 or higher. These new multi-functional resins can be cured into a thermoset state by crosslinking when reacted with tertiary, secondary or primary amines, anhydrides, acids, lewis acids, lewis bases, amides, imidizoles, ureas, melamines, cyanate esters and other commonly used curing agents and catalysts.

The epoxidation of p-hydroxystyrene-N generally produces a polymer (IV) with a high molecular weight, a relatively low epoxide equivalent weight and a high functionality, but this polymer is a solid. Therefore, such polymers are typically difficult to work with when trying to mix with reactive curing agents or catalysts. The epoxidized p-hydroxystyrene must be heated to liquefy it in order to achieve dispersion and promote mixing of the curing agents and catalysts.

The present inventor has surprisingly discovered that these processing difficulties can be overcome by cross epoxidation of low molecular weight di-hydric-phenols with high molecular weight (i.e. 4500–7000) p-hydroxystyrene. Preferred low molecular weight di-hydric-phenols for use in this aspect of the present invention include hydroquinone and resorcinol, each having a molecular weight of 110:

Hydroquinone

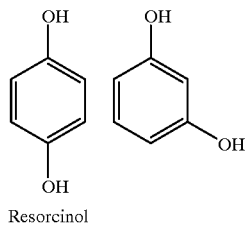

Resorcinol

The preferred high molecular weight p-hydroxystyrene is the previously noted polymer (II).

When di-hydric-phenols are reacted with p-hydroxystyrene (polymer (II)), and during the epoxidation process with epichlorohydrin in the presence of an alkali, polymeric products having various functionalities and molecular weights can be obtained. If the di-hydric-phenol and p-hydroxystyrene are present in a molar ratio between about 1 to 0.01 (100: 1) and about 2 to 1 of di-hydric-phenol to p-hydroxystyrene, an average functionality from about 5.2 to about 70 can be obtained.

As previously noted, in order to produce an epoxy resin having a low epoxide equivalent weight, it is desirable to epoxidize all phenol groups. Accordingly, an excess of epichlorohydrin for each equivalent of phenol should be employed. In accordance with a preferred aspect of this invention, an excess of about 2 to about 10 moles of epichlorohydrin for each mole of total phenol reactant is used.

The alkali present in the reaction mixture is preferably an alkali metal hydroxide such as sodium, potassium or lithium hydroxide, and is present in amount sufficient to neutralize the hydrochloric acid produced during the reaction, as well as to transform the chlorohydrin formed in the initial reaction of phenol and epichlorohydrin to an epoxide-containing molecule. Preferably this amount is between about 1 mole and about 4 moles of alkali per mole of total phenolic compounds. In order to improve yields the alkali solution may include an alcohol rather than water.

While the exact structural formulas for the various epoxide polymers of this aspect of the invention are not known, they may be represented as having the following theoretical structural formula (V):

(V)

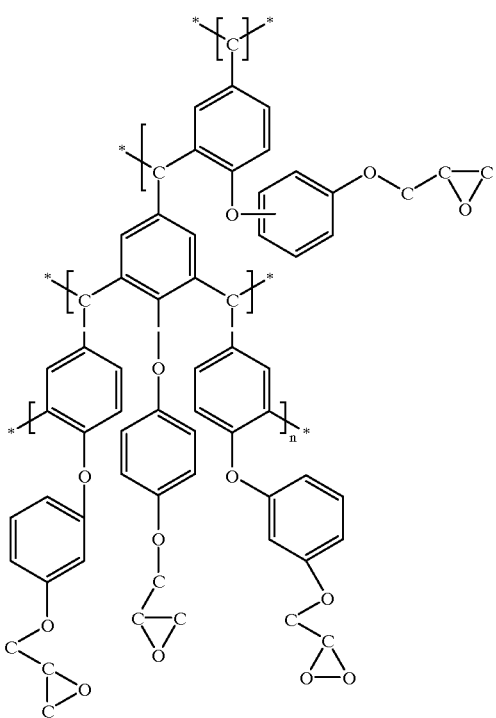

One of the major advantages of this coepoxidation, besides producing a product having high functionality at low viscosities, is the formation of ether linkage between one aromatic group of the p-hydroxystyrene and the di-hydric-phenol. Ether groups impart high toughness and flexibility without degrading the polymer. That is, incorporation of ether groups generally does not result in a decrease in the polymer's chemical resistance or its thermal resistance. The final epoxy polymer has a relatively low epoxide weight, preferably in the range from about 150 to about 260, and more preferably, from about 200 to about 260.

Epoxy resins prepared by this aspect of the present invention can be cured to a thermoset condition with tertiary, secondary or primary amines, anhydrides, lewis bases, amides, imidizoles, ureas, melamines, cyanate esters, and other commonly used curing agents and catalysts. Upon curing, the resulting materials exhibit Tg's above 300° C.

In both of the previously described preferred processes for forming epoxy polymers IV and V, it may be desirable to control the temperature of the reaction medium. Prior to, or during the early phase of the reaction, it may be desirable to heat the system to a temperature above ambient temperature. However, since the reaction is generally exothermic, it is preferred to provide a cooling system to ensure that the system does not reach an excessively high temperature.

The epoxy products produced in accordance with the present invention exhibit superior chemical resistance, higher temperature resistance, greater toughness, greater durability and higher degrees of cross-linking than conventional epoxy products. Although the epoxy products of the present invention, when cured, typically exhibit Tg's above 300° C., the present invention also includes epoxy materials having Tg's greater than 200° C. The preferred embodiment epoxy agents produced in accordance with the present invention typically have molecular weights of at least about 10,000, and usually at least about 20,000. However, the present invention includes epoxy agents having molecular weights less than 10,000.

The present invention epoxy resins and the processes for their production have a wide range of applications. The largest single use of epoxy resins is in the protective coatings market where high chemical resistance and adhesion is important. As a result of new ecology and energy requirements, increasing amounts of waterborne, high solids, and solventless systems (powder and liquid) are used. Cure mechanisms can be either one-package, heat-curing (baking) finishes, or room temperature-curing systems (including air-dried esters). It is contemplated that the preferred embodiment resins could be utilized in conjunction with or instead of the following systems.

Ambient-cure systems are often based on lower molecular weight liquid epoxy resins cured with aliphatic polyamines or polyamides. Curing normally occurs at ambient temperatures with a working life (pot life) of 15 to 60 minutes, depending on the formulation. Epoxy-polyamine systems are typically used for maintenance coatings in oil refineries, petrochemical plants, and in many marine applications. Such coverings are applied by spray or brush. These are used widely where water immersion is encountered, particularly in marine applications.

The higher molecular weight solid epoxy resins are used in formulations that usually consist of a resin, high solvents, hardener, reinforcing filler, pigments, flow control agents, and other modifiers. In addition to using conventional hardeners in these formulations, epoxy resins can also be hardened with other resins, ie, acrylics or polyesters.

Ester-type air dried coating systems provide better performance than alkyd coatings but lesser performance than straight epoxies. These coatings are simple esterification products of the epoxy resin with a fatty acid, resin acid, or a tall oil acid. They are available in short, medium, and long oil lengths similar to alkyds. Long oil length esters have limited chemical resistance, whereas the short oil length esters provide improved chemical resistance. The short oil length esters promote surface wetting similar to drying oils; therefore, they are often used when optimum surface preparation is not possible.

Heat curing finishes generally are based on the higher molecular-weight solid epoxy resins cross-linked with phenol, melamine, or urea-formaldehyde condensation products (phenoplasts and aminoplasts). Normal epoxy-aminoplast weight ratios in resins are epoxy-urea, 70:30; epoxy-benzoguanamine, 70:30; epoxy-melamine, 80:20, 90:10. Increasing the epoxy-aminoplast ratio provides: (1) improved flexibility, toughness, adhesion, and gloss; (2) reduced gloss retention, solvent resistance, and hardness; and (3) higher temperature baking schedules. In conjunction with the need to reduce energy consumption, accelerators are often used.

Epoxy-phenolic systems offer chemical resistance along with excellent mechanical properties. Resins of 4000–5000 molecular weight are used in conjunction with a phenolic that has a low degree of condensation. Part of the methylol groups may be etherified with butanol. Generally, the ratio of epoxy-phenolic ranges from 70:30 to 80:20, by weight, depending on the properties desired. Acid catalysts such as phosphoric acid or the morpholine salt of p-toluenesulfonic acid are often used to accelerate the cure. Such systems are used for chemically resistant coatings on process equipment, tank and drum linings, and in pipe lining.

Acid catalysts such as phosphoric acid or the morpholine salt of p-toluenesulfonic acid are often used to accelerate the cure. Such systems are used for chemically resistant coatings on process equipment, tank and drum linings, and in pipe lining.

Another application of the present invention epoxy resin is in waterborne coatings. These coatings utilize either liquid or solid epoxy resins that have been modified to allow their use with water. They are usually in the form of emulsions, suspensions, dispersions, or water-dilutable resins that can be heat- or RT-cured. They are applied by convenient methods such as roller-coating, dipping, spray, or electrodeposition.

Owing to governmental regulations, considerable research has been expended to develop systems suitable for substitution of solvent-based systems, particularly for automobile and container applications. In the switch from solvent-based to waterborne systems, epoxies are successfully bridging the gap largely by adaptation of conventional resins.

A waterborne system for container coatings was developed based on a graft copolymerization of an advanced epoxy resin and an acrylic. The acrylic-vinyl monomers are grafted onto preformed epoxy resins in the presence of a free radical initiator; grafting occurs mainly at the methylene group of the aliphatic backbone on the epoxy resin. The polymeric product is a mixture of methacrylic acid-styrene copolymer, slid epoxy resin, and graft copolymer of the unsaturated monomers onto the epoxy resin backbone. It is dispersible in water upon neutralization with an amine before cure with an amino-formaldehyde resin. It is contemplated that the preferred embodiment resins could be employed in waterborne systems.

Another application relates to solventless coatings. Ecological concerns have led to increasing uses of these materials. The advantages include high buildup in a single application, minimization of surface defects owing to the absence of solvents, excellent heat and chemical resistance, and lower overall application costs. Disadvantages include poor impact resistance and flexibility, short pot life, and increased sensitivity to humidity.

Attempts to overcome the short pot life have focused on development of special equipment in which the components can be mixed in the proper proportion. Another approach has been to develop curing agents that give long pot life compared to conventional systems.

The present invention epoxy resins may also be utilized in high solids coatings. High solids coatings resemble the technology of solvent-free coatings but the compositions contain approximately 70% by volume of solid resin and are modified by reactive diluents, low viscosity multifunctional resins, or backbone structures other than the bisphenol A moiety.

Yet another application for the present invention epoxy resin is for powder coatings. Epoxy-based powder coatings exhibit useful properties such as excellent adhesion, abrasion resistance, hardness, and chemical resistance. The application possibilities are diverse, including refrigerator liners, oil filters, hospital equipment, primers, shelving, automobile springs, and fire extinguishers.

Interest in powders is primarily related to meeting increasingly stringent antipollution regulations. The development of highly reactive powder systems which cure at low energy (150° C.) and the possibility of economical thin films (30–40 $\mu$m) or electrostatic spray (thin films, 30–40 $\mu$m).

In powder coatings, epoxies are continuing to grow at rates exceeding other technology segments mainly because of the 100% solids feature, improved coverage, and recyclability of material. Pipeline projects, important because of world-wide energy problems, are significant users of epoxy resins. The maintenance coating segment, although not spectacular in its overall growth, still provides a steady and solid base for epoxies. The value of improved service life is being increasingly accepted even at the somewhat higher material cost of epoxy systems.

To improve the weatherability of epoxies, which normally chalk and yellow, epoxy-polyester alloys or hybrids are used. These powders with improved overbake resistance cure at temperatures as low as 130° C. They have film flexibility similar to epoxy resins, but their hardness is slightly decreased. Corrosion resistance is equivalent to epoxy powders in most cases, although solvent and alkali resistance is inferior.

Another approach to weatherable systems is the use of triglycidyl isocyanurate as a curing agent for carboxyl-containing oil-free polyesters. The trifunctionality is responsible for its high reactivity with carboxyl-containing oil-free polyesters. These types of powder coatings are used in the protection of metal window frames, as well as for exterior siding.

The present invention epoxy resins are also useful in forming structural composites. Because of their excellent adhesion, good mechanical, humidity, and chemical resistance properties, epoxy resins are used extensively in combination with glass, graphite, boron, and Kevlar fibers in the manufacture of high performance composites.

An important application is for filament-wound glass-reinforced pipe used in oil fields, chemical plants, water distribution, and as electrical conduits. A most preferred application is in reinforced composite tank or container construction. Low viscosity liquid systems having good mechanical properties (elongation at break) when cured are preferred. These are usually cured with liquid anhydride or aromatic-amine hardeners. Similar systems are used for filament-winding pressure bottles and rocket motor casings.

In the aerospace industry, the use of graphite fiber-reinforced composites is growing rapidly because of high strength to weight ratios. High performance polyfunctional resins, such as the tetraglycidyl derivative of methylenedianiline in combination with diaminodiphenysulfone, are extensively used to provide good elevated temperature properties and humidity resistance. Handling characteristics are well suited to the autoclave molding technique primarily used in the manufacture of such components.

Improved versions of the high performance resin systems continue to be developed. Toughening of epoxies has emerged as an important area for investigation using both rubber and thermoplastics.

The present invention also finds wide use in electrical laminates. A significant use for epoxy resins is in the manufacture of copper-clad epoxy-glass printed circuit boards. Systems are available that meet the National Electrical Manufacturers Association (NEMA), G10, G11, FR3, FR4, FR5 specifications. Currently the majority of boards are manufactured to the flame-retardant FR4 specification. The flame retardance is achieved by the use of a solid epoxy resin based on tetrbromobisphenol. In combination with dicyandiamide as the hardener, stable impregnation varnishes can be formulated. The impregnated glass fabric can be dried and "B-staged" in a controlled manner by treating in a heated tunnel or tower. The B-staged fabric (prepreg) is cut into sheets and laid up into laminates with a copper foil top and bottom, and pressed at high pressure and elevated temperature to form a well-consolidated fully cured board. Identical procedures are used for making structural and electrical laminates usually based on nonflame-retardant resins.

Photoactive polymers containing epoxy groups are used in the manufacture of high performance printed wiring boards. A polymer with a UV-sensitive group allowing photocross-linking and an epoxy group for thermal cross-linking has been used as a photopolymerizable solder mask and in photoresists.

Furthermore, the present invention epoxy resins may be utilized in electrical, electronic, and structural applications. Thermoset epoxy molding compounds are multicomponent mixtures usually based on solid epoxy resins, hardeners, and various fillers and reinforcements. The exact nature of the compounds is usually dictated by the application and the molding procedure to be used, ie, transfer, compression, or injection molding. Because of the use of narrow gates in transfer and injection molding processes, the use of long-fiber reinforcement (>3 mm) is usually avoided because of the danger of excessive orientation of the fibers. In compression-molding procedures, this limitation does not apply and long-fiber reinforced molding compounds are frequently used. Because of the good adhesive properties and low shrinkage on cure of epoxy resins, internal release agents are frequently incorporated into the molding compound formulation. Care must be taken in designing the mold to allow sufficient draft to facilitate easy ejection of the part on demolding. The main use of epoxy molding compounds is for the encapsulation via transfer molding of solid-state devices such as diodes, transistors, and integrated circuits. The molding compounds are formulated to meet stringent requirements regarding flow, reactivity, electrical properties, humidity, and thermal resistance. Extensive testing and experience have shown that the best characteristics are achieved using a solid, mutifunctional, epoxidized cresol-novolak resin, and a phenol or cresol novolak as a hardener.

Low ionic impurity levels are imperative. In order to reduce the coefficient of thermal expansion of the final molding, and hence minimize stresses on the encapsulated silicon chip, the highest possible filler loading is desired. This has to be balanced against the need to maintain as low a melt viscosity as possible to minimize the possibility of damage to the device during the encapsulation process. Accordingly, the present invention epoxy resins are particularly well suited for such uses.

Epoxy molding compounds based on solid bisphenol A resins, frequently improved with solid epoxy phenol or cresol novolaks, and cured with novolaks or occasionally with solid anhydrides or aromatic amines, are used for encapsulating passive electronic components, ie, coils capacitors, transformers, ignition coils, etc. In such applications small amounts of short glass fiber in addition to particulate filler may be used to increase impact strength. Similar compounds frequently are used for molding high voltage electrical bushings and connectors used in pad-mounted distribution transformers.

Compression molding is mainly used in the manufacture of large, long-glass-fiber (up to 25 mm) reinforced parts. Chopped prepreg molding compounds, in which glass roving has been impregnated with a solid resin-hardener formulation and chopped to give strands of the desired length (usually 12–25 mm), and epoxy sheet-molding compounds are mainly used. These are characterized by excellent mechanical strength, rigidity, and good thermal or chemical resistance properties, or both. Components such as pump housings, impellers, pipe fittings, and valves are compression molded.

The superior epoxy resins of the present invention may also be used in casting and encapsulation applications. Cast components are made by filling a mold cavity with liquid epoxy system and then cross linking the resin to give an infusible solid part. The resin system used may be formulated to cure either at RT or at elevated temperatures. A problem with coating large parts is that during cure, the excess heat of reaction must be dissipated to avoid large locked-in-thermal stresses in the casting. This is achieved by skillful formulation but results in relatively long mold cycles and poor productivity.

Nevertheless, casting processes have found extensive uses where the good electrical and mechanical properties of epoxy resins offer many design advantages. The most commonly used systems are based on bisphenol A epoxy resins cured with anhydride hardeners and usually heavily (60–65 wt %) filled with silica fillers. Components using from 50–100 kg of mix are cast on a routine basis. Typical components manufactured by casting techniques are post insulators, busbar supports, switchgear components, instrument transformers, distribution transformers, high and low voltage bushings, encapsulated coils, etc. Poor wet arc-track resistance and uv resistance limit bisphenol A-based resins to indoor applications. For outdoor applications, the use of cycloaliphatic resins cured with a nonaromatic anhydride hardener, eg, hexahydrophthalic anhydride, is mandatory. Such systems have increasing use for outdoor insulators, switchgear components, and instrument transformers.

A casting process, pressure gelation, was developed that overcomes problems associated with the high heat of reaction of an epoxy resin. It allows large parts to be gelled rapidly, reducing the mold cycle from hours to minutes. The increased productivity is responsible for growing worldwide use in the electrical industry. The preferred embodiment resins described herein are well suited for such applications.

In addition to electrical uses, epoxy casting resins are utilized in the manufacture of tools, ie, contact and match molds, stretch blocks, vacuum-forming tools, and foundry patterns, as well as bench tops and kitchen sinks. Systems consist of a gel coat formulation designed to form a thin coating over the pattern which provides a perfect reproduction of the pattern detail. This is backed by a heavily filled epoxy system which also incorporates fiber reinforcements to give the tool its strength. For moderate temperature service, a liquid bisphenol A epoxy resin with an aliphatic amine is used. For higher temperature service, a modified system based on an epoxy phenol novolak and an aromatic diamine hardener may be used.

A common application for epoxies is for use in adhesive formulations. The present invention epoxy resins are particularly suited for such use. Because of excellent adhesion to many substrates, epoxy resins are extensively used for high performance adhesives. These can be categorized into high temperature curing systems (solids and liquids) and room temperature curing systems (liquids).

For the high temperature systems, dicyandiamide and aromatic-amine hardeners are frequently used. For room temperature systems, polyamide aminoamide, and aliphatic-amine hardeners are preferred.

Depending on the characteristics and performance requirements, adhesives systems are frequently modified with diluents (reactive and nonreactive) and polyfunctional high performance resins, as well as with fillers of various types.

In demonstrating procedures for preparing the preferred embodiment polymeric products described herein, a series of trials were carried out as follows:

EXAMPLE 1

A mixture of 465 grams (0.10 moles) of p-hydroxystyrene novolak (polymer II), 1860 grams (20.2 moles) of epichlorohydrin, 1086 grams isopropyl alcohol and 246 grams of water were placed in a 5 liter round bottom flask equipped with a mechanical stirrer, a condenser, thermometer and heating mantle and warmed with stirring to 80° C. 964 grams of 20% sodium hydroxide solution was then added dropwise over a period of 40 minutes. After reaction, excess epichlorohydrin and solvents were removed by distillation. In order to remove salts from the resin, the resin was dissolved in acetone and filtered. The acetone was removed by vacuum distillation. The epoxidized p-hydroxystyrene novolak obtained had a melting point of 110–120° C. with weight per epoxy of 249 and a molecular weight of 26,002.

EXAMPLE 2

50 grams of the product of Example 1, i.e. epoxidized p-hydroxystyrene novolak, with 1 gram of tricyanoethyl-2-phenyl imidazole was heated at 160° C. for 2 hours, 203° C. for 3 hours, and 227° C. for 4 hours to give a cured material having a glass transition temperature, Tg, of 357° C. based on DSC.

EXAMPLE 3

A mixture of 480 grams (0.07 mole) of p-hydroxystyrene linear grade homopolymer of 4-ethenyl phenol (polymer III), 1920 grams (20.86 moles) of epichlorohydrin, 1114 grams of isopropyl alcohol and 250 grams of water were placed in a 5 liter round bottom flask equipped with a mechanical stirrer, a condenser, thermometer and heating mantle, and warmed with stirring to 80° C. 979 grams of 20% sodium hydroxide solution was then added dropwise over a period of 40 minutes. After full reaction, excess epichlorohydrin, and solvents were removed by distillation. In order to remove salts from the resin, the resin was distilled in acetone and filtered. The acetone was removed by vacuum distillation. The epoxidized resin has a melting point of 80–90° C. with a weight per epoxy of 217 and a molecular weight of 24,605.

EXAMPLE 4

50 grams of the product of Example 3 was heated to 90° C. and mixed with 1 gram of tricyanoethyl-2-phenyl imidizole and cured at 160° C. for 2 hours, 203° C. for 2 hours and 227° C. for 4 hours and gave a cured material having a glass transition temperature of 321° C.

EXAMPLE 5

A mixture of 500 grams (0.10 moles) of p-hydroxystyrene novolak (polymer II), 500 grams (4.5 moles) of resorcinol, 4700 grams (50.5 moles) of epichlorohydrin, 2160 grams of isopropyl alcohol and 489 grams of water were placed in a round bottom flask equipped with a mechanical stirrer, a condenser, thermometer, and heating mantle and warmed while stirring to 80° C. To this mixture 1918 grams of 20% sodium hydroxide solution was then added dropwise over a period of 40 minutes. After reaction, excess epichlorohydrin and solvents are removed by vacuum distillation. In order to remove salts from the resin, the resin was dissolved in acetone and filtered. The acetone was removed by vacuum distillation. The coepoxidized polymer of p-hydroxystyrene novolak resorcinol has a viscosity of 638 centerpoises at 75° C., a molecular weight of 11,009, a weight per epoxy of 161 and a functionality of 68.

EXAMPLE 6

100 grams of (Example 5) coepoxidized p-hydroxystyrene and resorcinol with 2 grams 2-ethyl-4-methyl imidizole was heated at 122° C. for 2 hours, 175° C. for 2 hours, and 250° C. for 4 hours to give a hard and tough thermoset material having a glass transition temperature of 327° C. and an elongation of 11.5 percent.

As a comparison, a tetra-functional epoxy tetraglycidyl methylene dianiline having a viscosity of 15,000 centerpoises at 50° C. when cured with 2-ethyl-4-methyl imidizole exhibits a glass transition temperature of 198° C. and an elongation of 2.0 percent.

EXAMPLE 7

A mixture of 50 grams (0.01 moles) of p-hydroxystyrene (polymer II) and 450 grams (4.1 moles) of resorcinol, 2500 grams (26.9 moles) of epichlorohydrin, 1080 grams of isopropyl alcohol and 240 grams of water were placed in a flask equipped with a mechanical stirrer, a condenser, thermometer, and heating mantle and warmed while stirring to 80° C. To this mixture 959 grams of 20% sodium hydroxide solution was then added dropwise over a period of 40 minutes. After reaction, excess epichlorohydrin and solvents were removed by vacuum distillation. In order to remove salts from the resin, the resin was dissolved in acetone and filtered. The acetone was removed by vacuum distillation. The coepoxidized polymer of 0.01 moles of p-hydroxystyrene and 4.1 moles of resorcinol had a viscosity of 818 centerpoises at 24° C., a molecular weight of 640, a weight per epoxy of 128 and functionality of 4.5.

EXAMPLE 8

100 grams of (Example 7) coepoxidized p-hydroxystyrene and resorcinol with 3 grams of 2-ethyl-4-methyl imidizole was heated at 100° C. for 2 hours, 150° C. for 2 hours, and 203° C. for 4 hours to give a hard, tough, thermoset material having a glass transition temperature of 235° C. and an elongation of 8.2 percent.

The foregoing description is, at present, considered to be the preferred embodiments of the present invention. However, it is contemplated that various changes and modifications apparent to those skilled in the art, may be made without departing from the present invention. Therefore, the foregoing description is intended to cover all such changes and modifications encompassed within the spirit and scope of the present invention, including all equivalent aspects.

I claim:

1. The product produced by a method comprising:

providing at least one poly-p-hydroxystyrene polymer selected from the group consisting of polymer (I) having the structure:

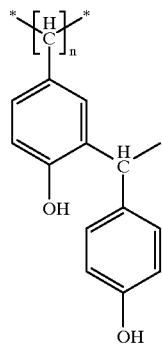

wherein n ranges from about 18 to about 30;
polymer (II) having the structure:

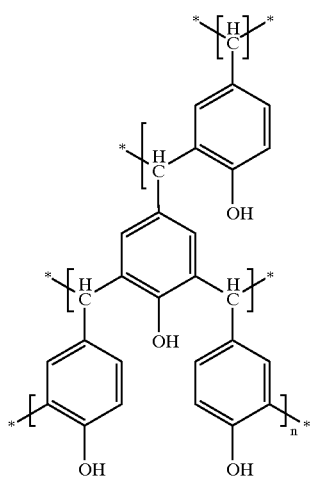

wherein n ranges from about 10 to about 20; and
polymer (III) having the structure:

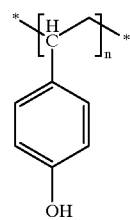

wherein n ranges from about 30 to about 600;
providing an effective amount of epichlorohydrin; and,
reacting said at least one poly-p-hydroxystyrene polymer and said epichlorohydrin in the presence of an alkaline agent to thereby produce said epoxy agent.

2. The product of claim 1, wherein said product has the structure:

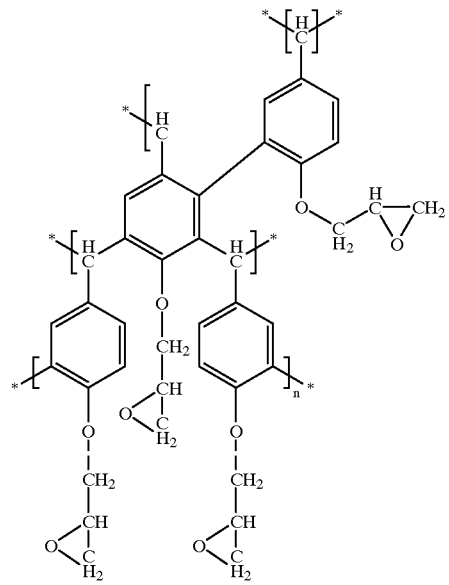

wherein n ranges from about 10 to about 26.

3. The product of claim 1, wherein said product has an epoxide equivalent weight from about 200 to about 260.

4. An epoxy compound having the formula:

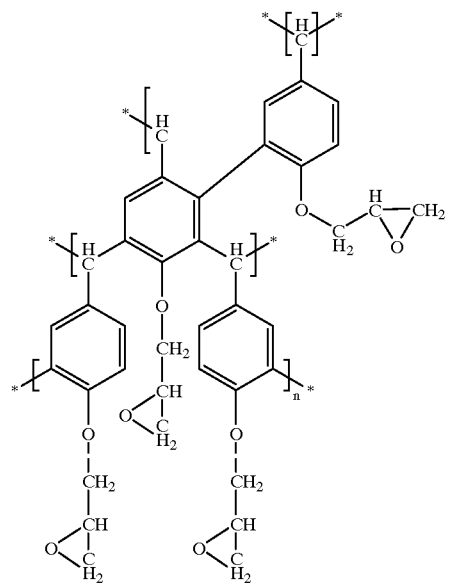

wherein n ranges from about 10 to about 26.

5. The epoxy compound of claim 4 wherein said compound has an epoxide equivalent weight of from about 200 to about 260.

* * * * *